(12) United States Patent
Kim et al.

(10) Patent No.: US 10,510,816 B2
(45) Date of Patent: Dec. 17, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Ki Wook Kim, Hwaseong-si (KR); Won Kyu Kwak, Seongnam-si (KR); Kwang-Min Kim, Seoul (KR); Dong Soo Kim, Seoul (KR); Joong-Soo Moon, Hwaseong-si (KR); Hyun Ae Park, Cheonan-si (KR); Ji-Eun Lee, Seoul (KR); Chang Kyu Jin, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/975,540

(22) Filed: May 9, 2018

(65) Prior Publication Data

US 2018/0337220 A1 Nov. 22, 2018

(30) Foreign Application Priority Data

May 19, 2017 (KR) ........................ 10-2017-0062459

(51) Int. Cl.
*H01L 27/32* (2006.01)
*H01L 51/56* (2006.01)
*H01L 51/00* (2006.01)

(52) U.S. Cl.
CPC ...... *H01L 27/3244* (2013.01); *H01L 51/0013* (2013.01); *H01L 51/56* (2013.01); *H01L 51/0097* (2013.01); *H01L 2251/5338* (2013.01)

(58) Field of Classification Search
CPC . H01L 27/3244; H01L 51/56; H01L 51/0097; H01L 51/0013; H01L 2251/5338; G06F 1/16
USPC ............ 257/40, 72, 81; 438/82, 99, 48, 128
See application file for complete search history.

(56) References Cited

U.S. PATENT DOCUMENTS

2015/0137102 A1 5/2015 Yang
2017/0020007 A1* 1/2017 Park et al. ........... H05K 5/0017

FOREIGN PATENT DOCUMENTS

KR 10-2015-0003572 1/2015

* cited by examiner

*Primary Examiner* — Thinh T Nguyen
(74) *Attorney, Agent, or Firm* — Lewis Roca Rothgerber Christie LLP (57) ABSTRACT

A display device according to an embodiment includes a substrate having a display area, and a peripheral area outside the display area including a first peripheral area adjacent to the display area, a first bending area extending from the first peripheral area, and a second peripheral area extending from the first bending area, and overlapping the first peripheral area, a display member at the display area, and including a first display area, and a second display area around the first display area, and a plurality of align keys on the substrate, wherein the first peripheral area includes a flat peripheral area corresponding to an area between the first display area and the first bending area, and a second bending area between the second display area and an end of the substrate, and wherein the plurality of align keys include a first align key at the flat peripheral area, and a second align key at the second peripheral area.

11 Claims, 7 Drawing Sheets

DISPLAY DEVICE AND MANUFACTURING METHOD THEREOF

CROSS-REFERENCE TO RELATED APPLICATION

This application claims priority to, and the benefit of, Korean Patent Application No. 10-2017-0062459 filed in the Korean Intellectual Property Office on May 19, 2017, the entire contents of which are incorporated herein by reference.

BACKGROUND

1. Field

The present disclosure relates to a display device and a manufacturing method thereof.

2. Description of the Related Art

In general, as a display device, a liquid crystal display (LCD), an organic light emitting device (e.g., an organic light emitting diode (OLED) display), and the like are used.

As a display unit, wiring, etc. are formed on a flexible substrate having flexibility (e.g., on a plastic substrate, which is a flexible material). Recently, increased attention is given to a flexible display device that is capable of displaying an image even when a part of the flexible substrate is bent as a next generation display device.

When the flexible substrate of these flexible display devices is bent, stress is applied to the bending area, which is the region of the flexible substrate to be bent. When the flexible substrate is not bent in the intended bending direction, and when the bending direction is distorted, the stress applied to the bending area further increases, and it may be easy to cause a crack in the wiring positioned at the bending area.

The above information is only for enhancement of understanding of the background of embodiments of the present disclosure, and therefore may contain information that does not form the prior art.

SUMMARY

An embodiment provides a display device capable of reducing or minimizing a crack in the bending area, and a manufacturing method thereof.

A display device according to an embodiment includes a substrate having a display area, and a peripheral area that is outside of the display area and includes a first peripheral area adjacent to the display area, a first bending area extending from the first peripheral area, and a second peripheral area extending from the first bending area, and overlapping the first peripheral area when the first bending area is bent, a display member at the display area for displaying an image, and including a first display area, and a second display area that is around the first display area, and a plurality of align keys on the substrate, wherein the first peripheral area includes a flat peripheral area corresponding to an area between the first display area and the first bending area, and a second bending area between the second display area and an end of the substrate, and wherein the plurality of align keys include a first align key at the flat peripheral area, and a second align key at the second peripheral area.

The first align key might not be at the second bending area or at the second display area.

The second display area and the second bending area may be bent together.

The first bending area may be under the substrate in a plane view, and the second bending area may be at a side of the substrate in a plane view.

The first align key and the second align key might not overlap, and may be separated from each other, in a plane view.

The first align key may include a left first align key at a left of the substrate, and a right first align key at a right of the substrate, and the second align key may include a left second align key at the left of the substrate, and a right second align key at the right of the substrate, wherein the left first align key and the left second align key do not overlap each other and are separated from each other in a plane view, and wherein the right first align key and the right second align key do not overlap each other and are separated from each other in a plane view.

A width of the first bending area may be less than a width of the first peripheral area, and a width of the second peripheral area may be less than the width of the first peripheral area.

A maximum curvature of the first bending area may be greater than a maximum value of the curvature of the second bending area.

The second bending area might not overlap the display area.

The display device may further include a protection film attached under the substrate, wherein the protection film includes a first protection film attached at a position corresponding to the first peripheral area and the display area, and a second protection film attached at a position corresponding to the second peripheral area, and wherein the first protection film and the second protection film are not attached at a position corresponding to the first bending area.

The display device may further include a supporting member between the first protection film and the second protection film.

A manufacturing method of a display device according to an embodiment includes forming a display member on a substrate having a display area, and a peripheral area that is outside of the display area, respectively forming a first align key and a second align key at a first peripheral area and a second peripheral area, which are separated with respect to a first bending area of the substrate, the first align key being at a flat peripheral area that is flat among the first peripheral area, attaching the display member to a window having a bent edge, bending the first bending area to cause the first peripheral area and the second peripheral area to overlap, and aligning the first peripheral area and the second peripheral area by using the first align key and the second align key.

The display area may include a first display area, and a second display area around the first display area, wherein the first peripheral area includes a second bending area between the second display area and an end of the substrate, and wherein attaching the display member to the window includes bending the second display area and the second bending area of the substrate together.

The first align key might not be at the second bending area or at the second display area.

The first bending area may be under the substrate in a plane view, and the second bending area may be at a side of the substrate in a plane view.

The method may further include bending the first bending area after bending the second bending area.

A width of the first bending area may be less than a width of the first peripheral area, and a width of the second peripheral area may be less than the width of the first peripheral area.

The method may further include attaching a protection film under the substrate, the protection film including a first protection film attached to a position corresponding to the first peripheral area and the display area, and a second protection film attached to a position corresponding to the second peripheral area, the first protection film and the second protection film not being attached at a position corresponding to the first bending area.

Aligning the first peripheral area and the second peripheral area may include measuring an interval between the first align key and the second align key using an alignment camera, and determining whether the measured interval matches a set interval match.

The method may further include confirming that the first align key and the second align key do not overlap each other and are separated in a plane view.

According to an embodiment, as the substrate is correctly bent in the intended bending direction, a stress applied to the substrate when bending the substrate may be reduced or minimized, thereby reducing or preventing the damage to the substrate under the bending.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
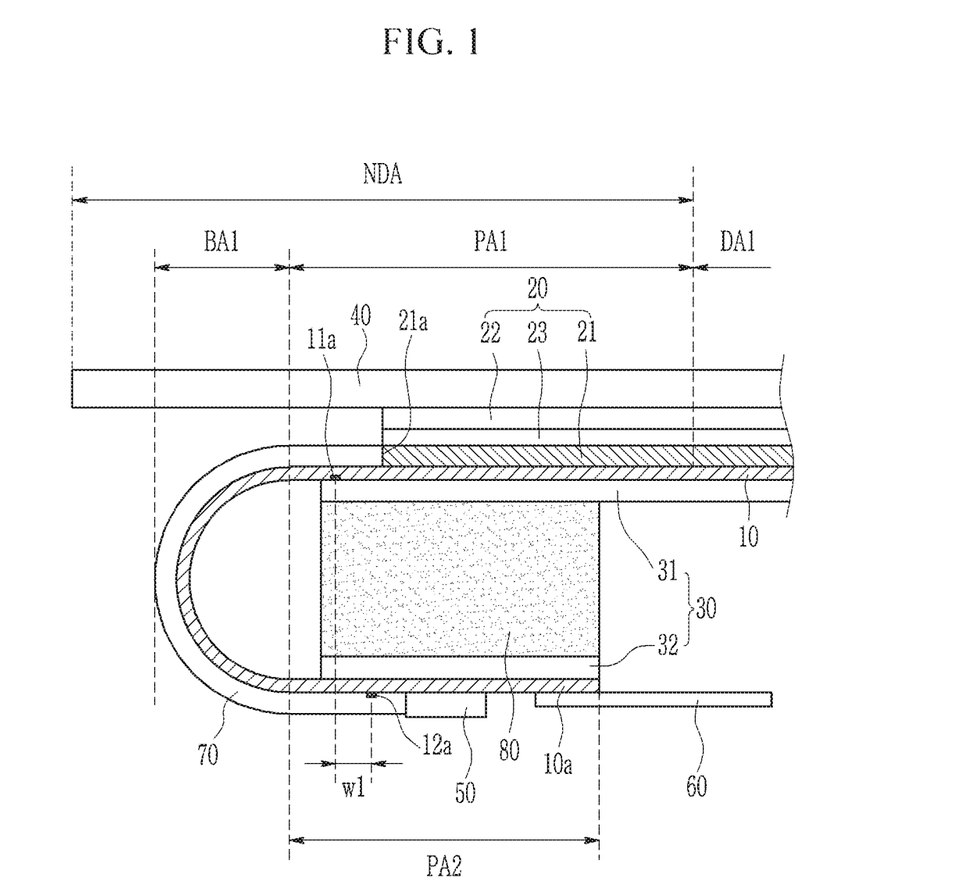
FIG. 1 is a schematic cross-sectional view of a display device according to an embodiment.
Figure 2:
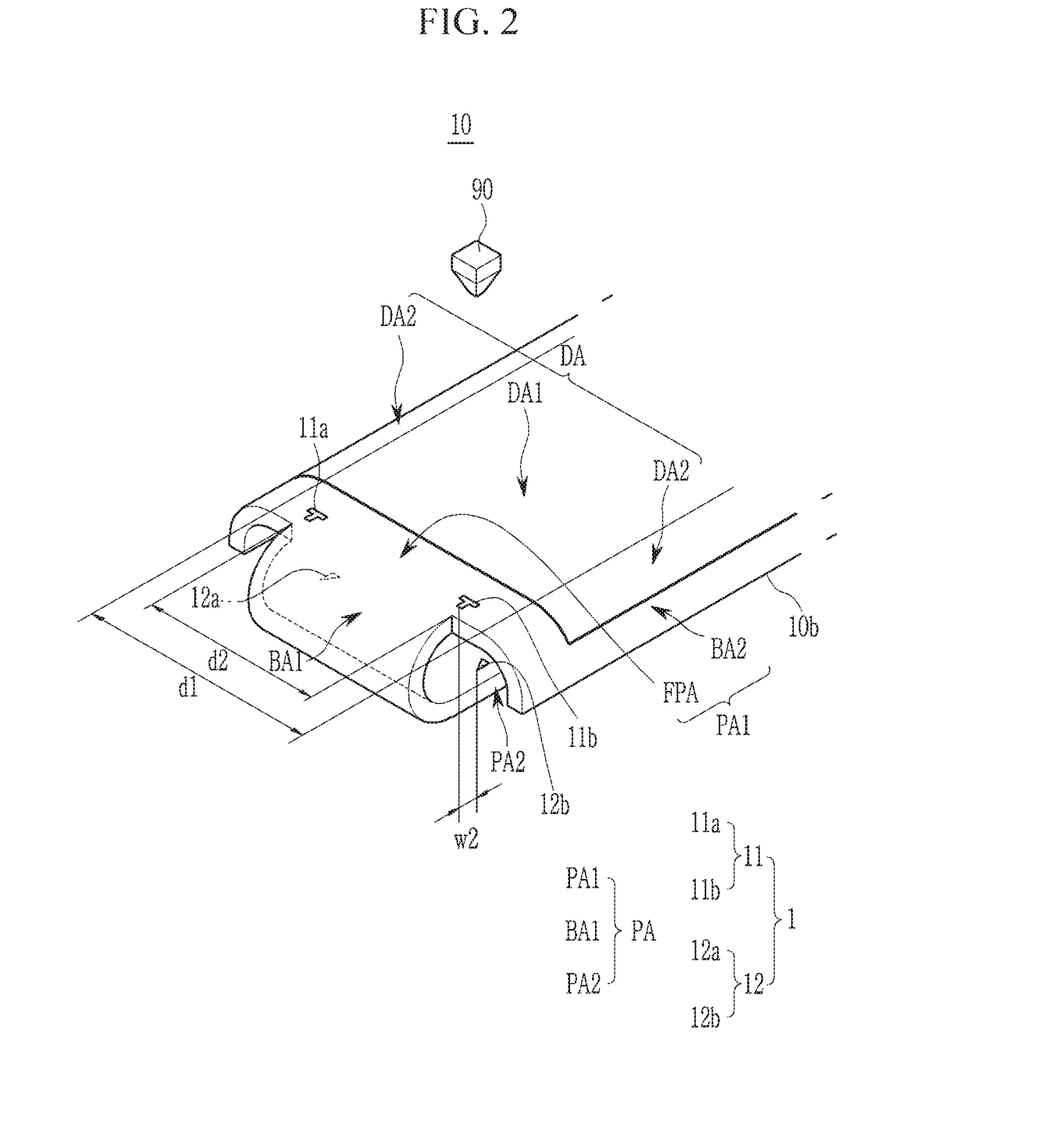
FIG. 2 is a perspective view only showing a part of the substrate of FIG. 1.

FIG. 1 is a schematic cross-sectional view of a display device according to an embodiment, and FIG. 2 is a perspective view only showing a part of the substrate of FIG. 1.

As shown in FIG. 1, a display device according to an embodiment may include a substrate 10, a display member 20 positioned on the substrate 10 for displaying an image, a protection film 30 attached under the substrate 10, and a window 40 covering and protecting the display member 20.

As shown in FIG. 1 and FIG. 2, the substrate 10 includes a display area DA corresponding to a part of the display member 20, and includes a peripheral area PA around the display area DA.

The display area DA includes a first display area DA1 that is most of, or a large portion of, a region of the substrate 10 and is flat, and a second display area DA2 that is positioned around the first display area DA1 and is bendable. The first display area DA1 may display the image to a front of the substrate 10, and the second display area DA2 may generally display the image to a side of the substrate 10.

The peripheral area PA includes a first peripheral area PA1 adjacent to the first display area DA1, a first bending area BA1 extending from the first peripheral area PA1 to be bent, and a second peripheral area PA2 extending from the first bending area BA1 and overlapping the first peripheral area PA1.

The first peripheral area PA1 includes a plane peripheral area, or a flat peripheral area, FPA corresponding to an area between the first display area DA1 and the first bending area BA1, and includes a second bending area BA2 corresponding to an area between the second display area DA2 and a side end part 10b of the substrate 10 to be bent.

The flat peripheral area FPA is positioned under the first display area DA1 in a plane view. Also, the first bending area BA1 is positioned between the flat peripheral area FPA and the second peripheral area PA2, and the second peripheral area PA2 is positioned between the first bending area BA1 and one end part 10a of the substrate 10. Here, "in a plane view" means that when the substrate 10 is viewed from above.

The substrate 10 may include a flexible substance so that the substrate 10 is bendable. For example, the substrate 10 may be a film type including one selected from a group including a polyester-based polymer, a silicon-based polymer, an acryl-based polymer, a polyolefin-based polymer, and/or a copolymer thereof. In detail, the substrate 10 may include one selected from a group including polyethylene terephthalate (PET), polybutylene terephthalate (PBT), polysilane, polysiloxane, polysilazane, polycarbosilane, polyacrylate, polymethacrylate, polymethylacrylate, polymethylmethacrylate, polyethylacrylate, polyethylmethacrylate, a cyclic olefin copolymer (COC), a cyclic olefin polymer (COP), polyethylene (PE), polypropylene (PP), polyimide (PI), polymethyl methacrylate (PMMA), polystyrene (PS), polyacetal (POM), polyetherether ketone (PEEK), polyester sulfone (PES), polytetrafluoroethylene (PTFE), polyvinyl chloride (PVC), polycarbonate (PC), polyvinylidene fluoride (PVDF), a perfluoroalkyl polymer (PFA), a styrene acrylonitrile copolymer (SAN), and/or combinations thereof.

The display member 20 may be a flat display panel, such as an organic light emitting panel, a liquid crystal panel, etc. The display member 20 may include a light emission member 21, a reflection-preventing layer 22 positioned on the light emission member 21, and a touch sensor 23 positioned between the light emission member 21 and the reflection-preventing layer 22 and used as an input device.

The light emission member 21 may include an emission layer for displaying the image, and a switching element for turning the display of the image on/off.

The reflection-preventing layer 22, as a layer for reducing or preventing reflection of external light to improve a display quality, may include a plurality of thin film layers. The plurality of thin film layers may include at least one metal thin film layer and at least one dielectric layer that are alternately deposited.

In the present embodiment, the reflection-preventing layer 22 is patterned in the same shape as the light emission member 21, however it is not limited thereto, and the reflection-preventing layer 22 may extend to the first bending area BA1 to also serve as a bending protecting layer.

Also, in the present embodiment, the reflection-preventing layer 22 is positioned in the display member 20, however it is not limited thereto, and the reflection-preventing layer 22 as a separate polarization film may be attached to an exterior of, or outside of, the display member 20.

The protection film 30 may include a first protection film 31 and a second protection film 32 that are separated from each other. The first protection film 31 may be attached at the position corresponding to the first peripheral area PA1 and the display area DA of the substrate 10. The second protection film 32 may be attached at the position corresponding to the second peripheral area PA2 of the substrate 10. That is, the first protection film 31 and the second protection film 32 are not attached to the position corresponding to the first bending area BA1 of the substrate 10. Accordingly, stress acting on the substrate 10 and the protection film 30 may be reduced or minimized when bending the substrate 10 such that damage to the substrate 10 may be reduced or prevented in the bending area BA1 during the bending. In the present embodiment, the protection film 30 is not attached to the first bending area BA1 of the substrate 10, however the protection film 30 is not limited thereto, and a groove may be formed in the protection film 30 at a position corresponding to the first bending area BA1 of the substrate 10.

The first protection film 31 and the second protection film 32 are positioned to face each other. A supporting member 80 may be positioned between the first protection film 31 and the second protection film 32. The second peripheral area PA2 of the substrate 10, which may extend from the first bending area to be beneath the first peripheral area PA1, may be moved to be closer to the first peripheral area PA1 due to an external impact. In this case, when a curvature of the first bending area BA1 increases, the stress may increase in the first bending area BA1. Accordingly, as the supporting member 80 is positioned between the first protection film 31 and the second protection film 32, the distance between the first peripheral area PA1 and the second peripheral area PA2 of the substrate 10 may be secured to prevent the first peripheral area PA1 and the second peripheral area PA2 from moving closer to each other. Accordingly, the supporting member 80 reduces or prevents increased stress to the first bending area BA1 caused by an external impact.

The window 40 may be attached on the reflection-preventing layer 22. The window 40 may extend to the peripheral area PA including the first bending area BA1, as well as to the display area DA of the substrate 10. Accordingly, the window 40 may protect the first bending area BA1 from the external impact.

A driving circuit chip 50 for generating a driving signal to drive the display member 20 may be positioned in the second peripheral area PA2 of the substrate 10. Also, a printed circuit board (PCB) 60 for generating an external signal to be transmitted to the driving circuit chip 50 or to the display member 20 may be attached to the one end part 10a of the substrate 10.

A bending protection layer 70 may be positioned on the peripheral area PA of the substrate 10. In the present embodiment, the bending protection layer 70 may be positioned from one end part 21a of the display member 20 to the end part of the driving circuit chip 50 while extending through the first bending area BA1. However, a formation position of the bending protection layer 70 is not limited to the present embodiment, and numerous variations capable of covering the first bending area BA1 are possible.

The bending protection layer 70 controls the position of a neutral plane (NP) that is a position where a strain becomes substantially zero so that the stress applied to the substrate 10 becomes a compressive stress as opposed to a tensile stress. Accordingly, as the bending protection layer 70 covers the first bending area BA1 of the substrate 10, damage to the first bending area BA1 of the substrate 10 may be reduced or minimized.

An elastic modulus of the bending protection layer 70 may be about 500 MPa to about 100 GPa. However, it is not limited thereto, and the elastic modulus of the bending protection layer 70 may be changed depending on a design condition, such as the thickness of the substrate 10, etc.

The bending protection layer 70 may include a resin based on acryl or silicon, or may include fine particles in the resin. The fine particles may include a rubber including silica, an epoxy, a polymer-based nanoparticle such as an epoxy hybrid, a microparticle, etc. In addition, the bending protection layer 70 may include various films including polyethylene ether phthalate (PET), etc.

Figure 3:
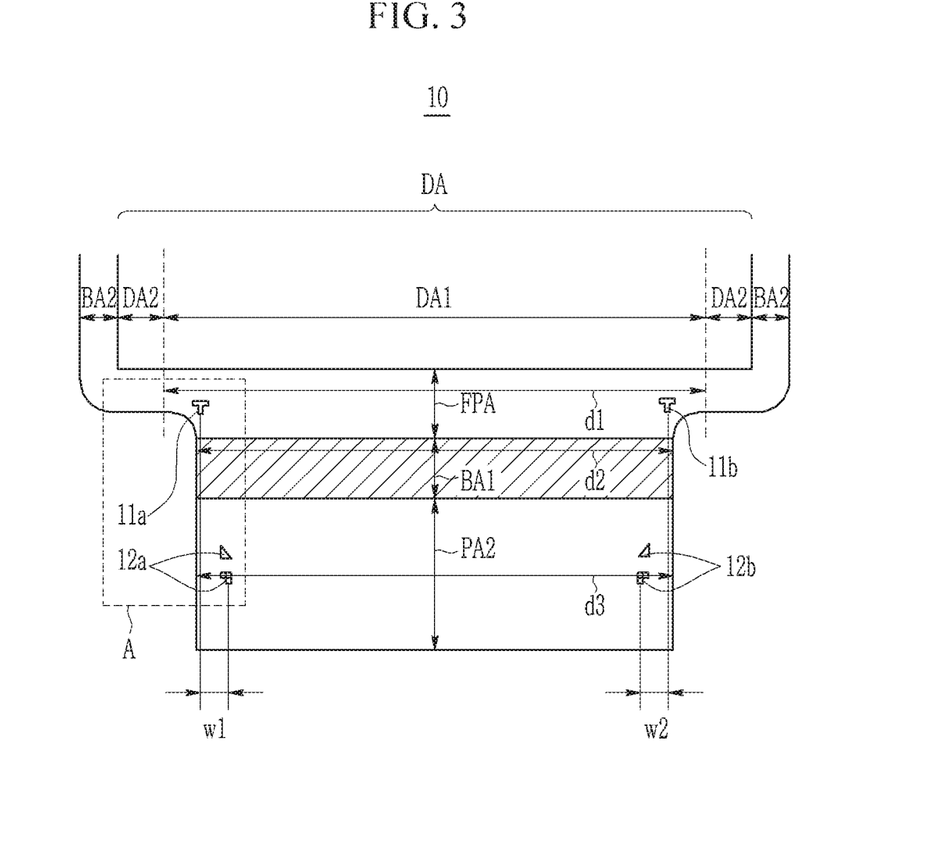
FIG. 3 is a top plan view of a part before bending the substrate of FIG. 1.
Figure 4:
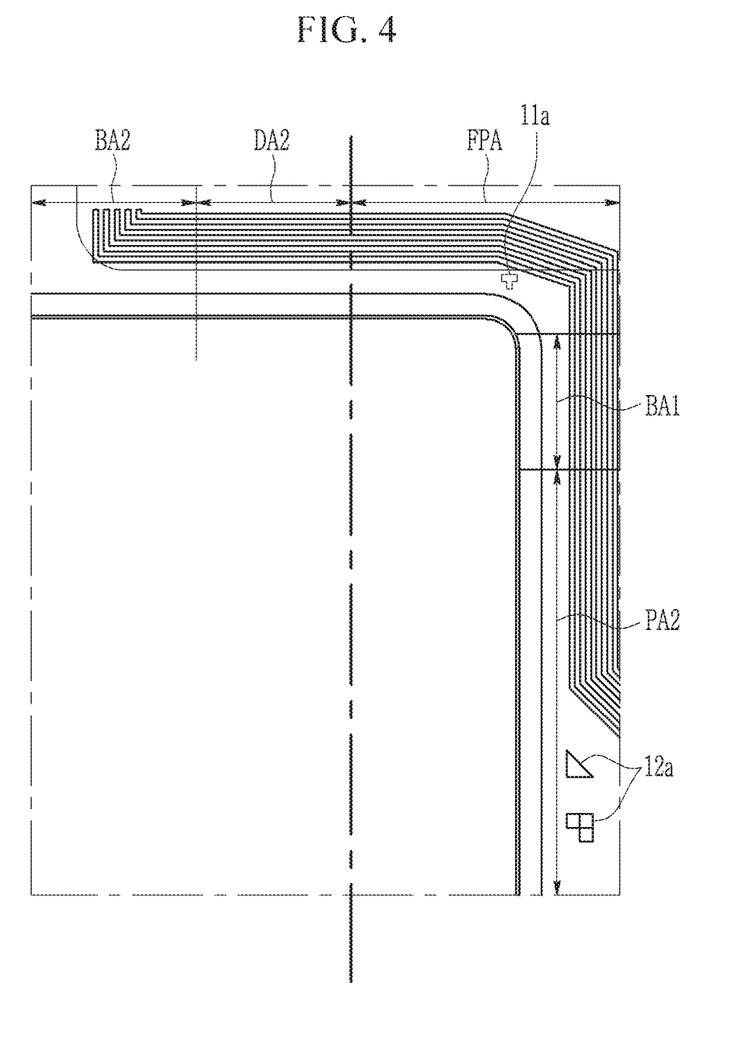
FIG. 4 is an enlarged top plan view of a part A of FIG. 3.
Figure 5:
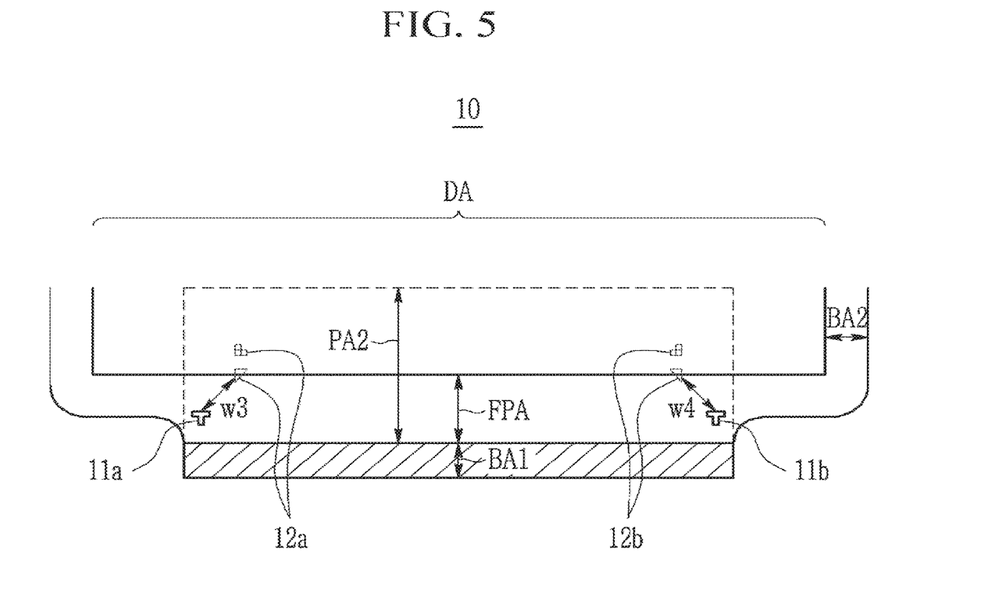
FIG. 5 is a top plan view of a part after bending the substrate of FIG. 1.

FIG. 3 is a top plan view of a part before bending the substrate of FIG. 1, FIG. 4 is an enlarged top plan view of a part A of FIG. 3, and FIG. 5 is a top plan view of a part after bending the substrate of FIG. 1.

As shown in FIG. 2 to FIG. 5, a width d2 of the first bending area BA1 protruded and extending from the flat peripheral area FPA may be less than a width d1 of the flat peripheral area FPA. Also, a width d3 of the second peripheral area PA2 may be the same as the width d2 of the first bending area BA1. Accordingly, the width d3 of the second peripheral area PA2 may be less than the width d1 of the flat peripheral area FPA.

Accordingly, as shown in FIG. 2, the bent first bending area BA1 and the second peripheral area PA2 do not interfere with the bent second bending area BA2 and the second display area DA2.

The second display area DA2, the first bending area BA1, and the second bending area BA2 correspond to a region at which the curvature is more than 0. The first bending area BA1 of the present embodiment corresponds to a region from one position where the curvature begins to be greater than 0, to another position where the curvature gradually becomes larger, again decreases, and to another position just before where the curvature reaches 0. As described above, as the second peripheral area PA2 overlaps the first peripheral area PA1 due to bending the first bending area BA1 among the peripheral area PA of the substrate 10, the width of the non-display area NDA where the image is not displayed may be reduced or minimized (e.g., in a plane view). The non-display area NDA, as a part where the image is not displayed when viewing the display device from the front, may include the first peripheral area PA1 and the first bending area BA1.

A maximum value of the curvature of the first bending area BA1 may be greater than the maximum value of the curvature of the second bending area BA2. In the present embodiment, even though the second bending area BA2 is bent, the second bending area BA2 does not overlap the display area.

Also, as the second display area DA2 and the second bending area BA2 according to the present embodiment are bent together (e.g., concurrently, or during a same process), the image may be displayed to the side in the second display area DA2 (e.g., displayed at an angle with respect to the first display area DA1).

As shown in FIG. 1 to FIG. 4, a plurality of align keys 1 are positioned on the substrate 10. The plurality of align keys 1 include a first align key 11 positioned in the flat peripheral area FPA and a second align key 12 positioned in the second peripheral area PA2.

When the substrate 10 is bent in the second bending area BA2, it may be confirmed whether the substrate 10 is bent in the intended direction by using the first align key 11 and the second align key 12. That is, it may be confirmed whether the substrate 10 is aligned in the intended direction by measuring an interval between the first align key 11 positioned in the flat peripheral area FPA of the substrate 10 and the second align key 12 positioned in the second peripheral area PA2, and by determining whether the interval matches a selected (e.g. predetermined) interval.

The first align key 11 includes a left first align key 11a positioned at a left part of the substrate 10, and a right first align key 11b positioned at a right part of the substrate 10. The second align key 12 includes a left second align key 12a positioned at a left part of the substrate 10, and a right second align key 12b positioned at a right part of the substrate 10.

As shown in FIG. 3, the left first align key 11a and the left second align key 12a do not overlap each other in a plane view, and are positioned to be separated from each other by a first interval w1. Also, the right first align key 11b and the right second align key 12b do not overlap each other in a plane view, and are positioned to be separated from each other by a second interval w2.

Accordingly, as shown in FIG. 5, when the substrate 10 is bent, the left first align key 11a and the left second align key 12a are positioned to be separated by a diagonal interval w3 in a plane view, and the right first align key 11b and the right second align key 12b are positioned to be separated by a diagonal interval w4 in a plane view.

Then it may be tested whether the diagonal interval w3 between the left first align key 11a and the left second align key 12a matches the set (e.g., predetermined) diagonal interval to determine whether and how much the second peripheral area PA2 of the substrate 10 twists (e.g., twists to the left).

Also, it may be tested whether the diagonal interval w4 between the right first align key 11b and the right second align key 12b matches the corresponding set (e.g., predetermined) diagonal interval to determine whether and how much the second peripheral area PA2 of the substrate 10 twists (e.g., twists to the right).

In the present embodiment, the first align key 11 has a 'T' shape, and the second align key 12 has two portions including a triangle shape and an 'L' shape, although the present embodiment is not limited thereto, and it is possible to form align keys of various shapes for allowing the alignment. Also, in the present embodiment, one first align key 11 is shown, and two second align keys 12 are shown (e.g., on each side, left and right, for alignment), however the present embodiment is not limited thereto, and a number of align keys may be variously changed.

The first align key 11 is positioned in the flat peripheral area FPA, and is not positioned in the second display area DA2 or in the second bending area BA2.

Accordingly, the shape of the first align key 11 is not changed even if the second display area DA2 and the second bending area BA2 are bent at the side display. If the first align key 11 is positioned in the second bending area BA2, the shape may be changed when bending the second bending area BA2, thereby potentially making it difficult to correctly confirm an alignment degree. Accordingly, as the first align key 11 is positioned in the flat peripheral area FPA, it may be confirmed that the substrate 10 is correctly bent in the intended direction.

A manufacturing method of the display device according to an embodiment will now be described with reference to accompanying drawings.

Figure 6:
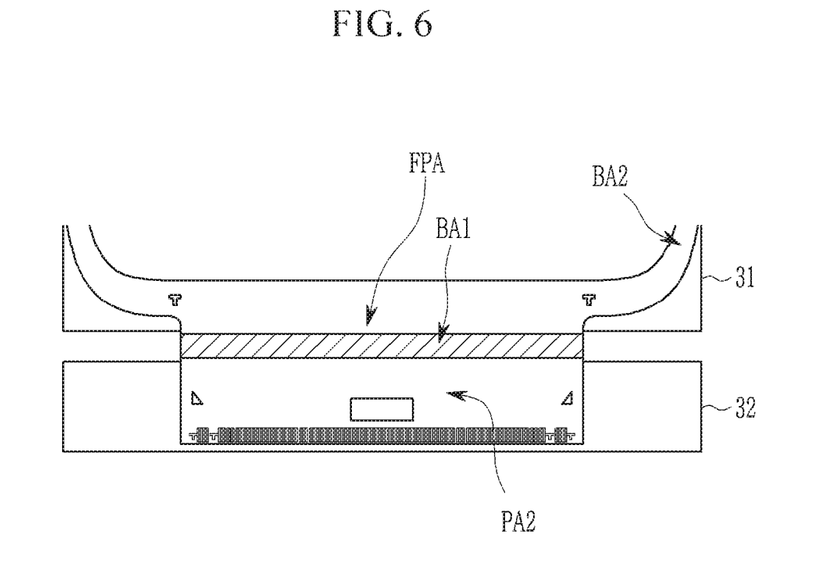
FIG. 6 is a view showing one step of a manufacturing method of the display device of FIG. 1.
Figure 7:
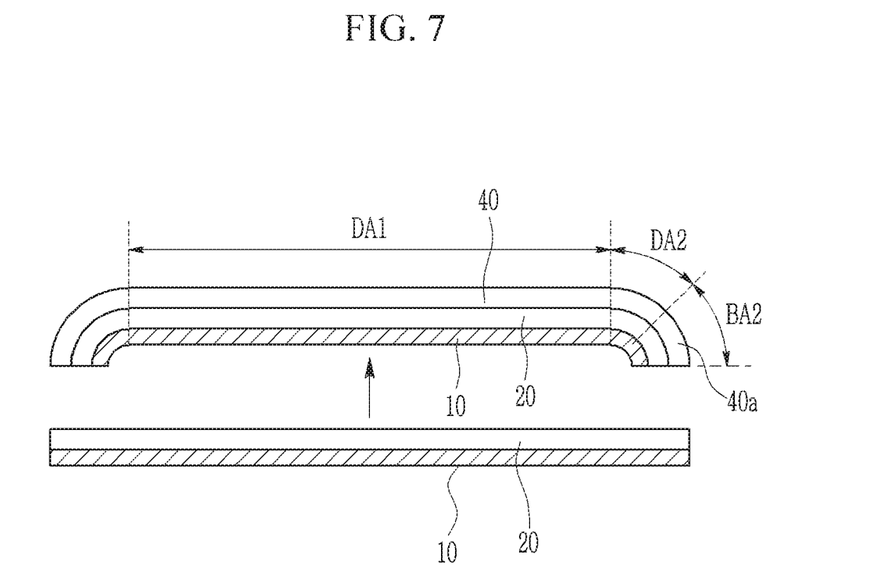
FIG. 7 is a view showing a step following that of FIG. 6, and showing a step of bending a second display area and a second bending area of a substrate after attaching the substrate to a window.

FIG. 6 is a view showing one step of a manufacturing method of the display device of FIG. 1, and FIG. 7 is a view showing a step following that of FIG. 6, and showing a step of bending a second display area and a second bending area of a substrate after attaching the substrate to a window.

First, as shown in FIG. 1, a display member 20 is formed on a substrate 10. Also, as shown in FIG. 1 and FIG. 3, the substrate 10 includes a display area DA corresponding to a part of the display member 20, and includes a peripheral area PA that is outside of the display area DA. The display area DA includes a first display area DA1, and a second display area DA2 positioned around, or at sides of, the first display area DA1. The first peripheral area PA1 includes a second bending area BA2 that corresponds to an area between the second display area DA2 and a side end part 10b of the substrate 10 and that is bent. A first align key 11 and a second align key 12 are respectively formed in the first peripheral area PA1 and in the second peripheral area PA2 of the substrate 10, which are separated by the first bending area BA1 of the substrate 10. The first align key 11 and the second align key 12 do not overlap each other in a plane view, and are positioned to be separated. The first bending area BA1 is positioned at a lower part of the substrate 10, and the second bending area BA2 is positioned at a side part(s) of the substrate 10 in a plane view. In this case, the width d2 of the first bending area BA1 is formed to be less than the width d1 of the first peripheral area PA1, and the width d3 of the second peripheral area PA2 may be formed to be less than the width d1 of the first peripheral area PA1. Accordingly, when bending the second bending area BA2 and the second display area DA2, and when bending the first bending area BA1, the first bending area BA1 and the second peripheral area PA2 do not interfere with the second bending area BA2 and the second display area DA2. Also, a bending protection layer 70 is formed at the part of the peripheral area PA of the substrate 10.

Next, as shown in FIG. 1 and FIG. 6, a protection film 30 is attached under the substrate 10. The protection film 30 includes a first protection film 31 attached at the position corresponding to the first peripheral area PA1 and the display area DA, and a second protection film 32 attached at the position corresponding to the second peripheral area PA2. To reduce or minimize the stress of the first bending area BA1 during the bending, the first protection film 31 and the second protection film 32 are not attached at a position corresponding to the first bending area BA1.

Next, as shown in FIG. 1, a driving circuit chip 50 and a printed circuit board (PCB) 60 may be attached to the second peripheral area PA2 of the substrate 10. In the present embodiment, the driving circuit chip 50 and the printed circuit board (PCB) 60 may be attached to the substrate 10 after attaching the protection film 30 under the substrate 10, although the present embodiment is not limited thereto, and the driving circuit chip 50 and the printed circuit board (PCB) 60 may be attached on the substrate 10 before attaching the protection film 30 under the substrate 10, and this process order may be variously changed.

Next, as shown in FIG. 7, the display member 20 is attached to the window 40 of which an edge 40a is bent. In this case, the second display area DA2 and the second bending area BA2 of the substrate 10 may be bent together (e.g., during a same process, or substantially concurrently).

Next, as shown in FIG. 2, the first bending area BA1 may be bent to cause the first peripheral area PA1 and the second peripheral area PA2 to overlap. Also, an alignment state of the first align key 11 and the second align key 12 may be confirmed by an alignment camera 90 to align the first peripheral area PA1 and the second peripheral area PA2. When confirming the first align key 11 and the second align key 12 through the alignment camera 90 in front of the substrate 10, the first align key 11 corresponds to an upper align key and the second align key 12 corresponds to a lower align key.

The first align key 11 is positioned at the flat peripheral area FPA that is flat among the first peripheral area PA1. That is, the first align key 11 is not positioned at the second bending area BA2 or at the second display area DA2. Accordingly, the shape of the first align key 11 is not changed even if the second display area DA2 and the second bending area BA2 are bent. As above-described, as the first align key 11 is positioned at the flat peripheral area FPA, it may be confirmed whether the substrate 10 is correctly bent in the intended direction.

Accordingly, as it is confirmed that the intervals w3 and w4 between respective parts of the first align key 11 and the second align key 12 in a plane view measured by using the alignment camera 90, and as the set (e.g., predetermined) intervals are respectively matched, it may be determined whether and how much the second peripheral area PA2 twists as a result of the bending.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
   a substrate having a display area, and a peripheral area that is outside of the display area and comprises:
      a first peripheral area adjacent to the display area;
      a first bending area extending from the first peripheral area; and
      a second peripheral area extending from the first bending area, and overlapping the first peripheral area when the first bending area is bent;
   a display member at the display area for displaying an image, and comprising a first display area, and a second display area that is around the first display area; and
   a plurality of align keys on the substrate,
   wherein the first peripheral area comprises:
      a flat peripheral area corresponding to an area between the first display area and the first bending area; and
      a second bending area between the second display area and an end of the substrate, and
   wherein the plurality of align keys comprise a first align key at the flat peripheral area, and a second align key at the second peripheral area.

2. The display device of claim 1, wherein the first align key is not at the second bending area or at the second display area.

3. The display device of claim 1, wherein the second display area and the second bending area are bent together.

4. The display device of claim 1, wherein the first bending area is under the substrate in a plane view, and wherein the second bending area is at a side of the substrate in a plane view.

5. The display device of claim 1, wherein the first align key and the second align key do not overlap, and are separated from each other, in a plane view.

6. The display device of claim 5, wherein the first align key comprises a left first align key at a left of the substrate, and a right first align key at a right of the substrate, wherein the second align key comprises a left second align key at the left of the substrate, and a right second align key at the right of the substrate, wherein the left first align key and the left second align key do not overlap each other and are separated from each other in a plane view, and wherein the right first align key and the right second align key do not overlap each other and are separated from each other in a plane view.

7. The display device of claim 1, wherein a width of the first bending area is less than a width of the first peripheral area, and wherein a width of the second peripheral area is less than the width of the first peripheral area.

8. The display device of claim 1, wherein a maximum curvature of the first bending area is greater than a maximum value of the curvature of the second bending area.

9. The display device of claim 1, wherein the second bending area does not overlap the display area.

10. The display device of claim 1, further comprising a protection film attached under the substrate, wherein the protection film comprises a first protection film attached at a position corresponding to the first peripheral area and the display area, and a second protection film attached at a position corresponding to the second peripheral area, and wherein the first protection film and the second protection film are not attached at a position corresponding to the first bending area.

11. The display device of claim 10, further comprising a supporting member between the first protection film and the second protection film.

\* \* \* \* \*